United States Patent
Smeys et al.

(10) Patent No.: US 9,796,580 B2
(45) Date of Patent: Oct. 24, 2017

(54) CMOS-MEMS-CMOS PLATFORM

(71) Applicant: InvenSense, Inc., San Jose, CA (US)

(72) Inventors: Peter Smeys, San Jose, CA (US); Martin Lim, San Mateo, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 14/738,745

(22) Filed: Jun. 12, 2015

(65) Prior Publication Data

US 2016/0362293 A1    Dec. 15, 2016

(51) Int. Cl.
*B81B 7/00*    (2006.01)

(52) U.S. Cl.
CPC ...... *B81B 7/007* (2013.01); *B81B 2201/0207* (2013.01); *B81B 2201/0214* (2013.01); *B81B 2201/0228* (2013.01); *B81B 2201/0235* (2013.01); *B81B 2201/0242* (2013.01); *B81B 2201/0257* (2013.01); *B81B 2201/0264* (2013.01); *B81B 2201/0271* (2013.01); *B81B 2201/0278* (2013.01); *B81B 2203/0315* (2013.01); *B81B 2207/012* (2013.01)

(58) Field of Classification Search
None
See application file for complete search history.

(56) References Cited

U.S. PATENT DOCUMENTS

| 8,936,959 | B1 * | 1/2015 | Yang | B81C 1/00238 438/48 |
|---|---|---|---|---|
| 9,327,964 | B2 | 5/2016 | Allegato et al. | |
| 9,400,288 | B2 * | 7/2016 | Feyh | G01P 15/0802 |
| 9,567,207 | B2 | 2/2017 | Tseng et al. | |
| 2004/0227201 | A1 * | 11/2004 | Borwick, III | B81C 1/00238 257/414 |
| 2015/0028432 | A1 * | 1/2015 | Kim | B81B 3/001 257/415 |
| 2015/0251903 | A1 * | 9/2015 | Bowles | H01L 25/50 257/415 |

(Continued)

OTHER PUBLICATIONS

Choa, "Reliability of vaccuum packaged MEMS gyroscopes", Microelectronics Reliability vol. 45, Iss 2, May 4, 2004, 361-369.

(Continued)

*Primary Examiner* — Reema Patel
*Assistant Examiner* — Steven Christopher

(57) ABSTRACT

A sensor chip combining a substrate comprising at least one CMOS circuit, a MEMS substrate and another substrate comprising at least one CMOS circuit in one package that is vertically stacked is disclosed. The package comprises a sensor chip further comprising a first substrate with a first surface and a second surface comprising at least one CMOS circuit; a MEMS substrate with a first surface and a second surface; and a second substrate comprising at least one CMOS circuit. Where the first surface of the first substrate is attached to a packaging substrate and the second surface of the first substrate is attached to the first surface of the MEMS substrate. The second surface of the MEMS substrate is attached to the second substrate. The first substrate, the MEMS substrate, the second substrate and the packaging substrate are mechanically attached and provided with electrical inter-connects.

11 Claims, 4 Drawing Sheets

(56) References Cited

U.S. PATENT DOCUMENTS

| | | | |
|---|---|---|---|
| 2016/0046483 A1* | 2/2016 | Cheng | B81B 7/008 |
| | | | 257/692 |
| 2016/0137492 A1* | 5/2016 | Cheng | B81C 1/00238 |
| | | | 257/415 |
| 2017/0008760 A1 | 1/2017 | Lloyd et al. | |

OTHER PUBLICATIONS

MEMS Investor Journal Interview, "Through Substrate Vias: Opportunities for CMOS MEMS and 3D Integration", available online: http://www.memsjournal.com/2012/02/through-substrate-vias-opportunities-for-cmos-mems-and-3d-integration.html as of Mar. 17, 2012.

Qu, et al., "Process Development for CMOS-MEMS Sensors with Robust Electrically Isolated Bulk Silicon Microstructures", Journal of Microelectromechanical Systems, vol. 16, No. 5, Oct. 2007, 1152-1161.

Sood, et al., "Al—Ge Eutectic Wafer Bonding and Bond Characterization for CMOS Compatible Wafer Packaging", 218th Electrochemical Society Meeting held Oct. 15, 2010 copyright 2010 pp. 1.

Xie, et al., "Fabrication, Characterization, and Analysis of a DRIE CMOS-MEMS Gyroscope", IEEE Sensors Journal, vol. 3, No. 5, Oct. 2003, 622-631.

* cited by examiner

000

CMOS-MEMS-CMOS PLATFORM

FIELD OF THE INVENTION

The present invention relates generally to micro-electro-mechanical systems (MEMS) devices, and more particularly to the package containing a MEMS substrate integrated with CMOS substrates.

BACKGROUND OF THE INVENTION

As more and more MEMS devices become smaller and smaller, it will be useful to have a MEMS device where two different CMOS substrates to provide electronic circuits are connected to a MEMS substrate. This is particularly useful as more functionality can be added to the CMOS substrate at the same time keeping the form factor small. Furthermore, performance and reliability of the MEMs device can be improved by lowering interconnect parasitic resistance, capacitance and inductance. Combining a CMOS, MEMS and another CMOS in one package that is vertically stacked results in a smaller package with reduced requirements for board area or "real estate." This stacking structure is also beneficial when the upper CMOS die is smaller than the lower CMOS die and MEMS die such as triple die stack, using CMOS as a cap.

Accordingly, it is desired to have a MEMS device that addresses the requirements of more functionality at the same time keeping the form factor small as well as improvement in the device function and reliability by lowering interconnect parasitics such as resistance, capacitance and inductance. The present invention addresses such a need.

SUMMARY

A sensor chip combining a substrate comprising at least one CMOS circuit, a MEMS substrate and another substrate comprising at least one CMOS circuit in one package that is vertically stacked is disclosed. The package comprises a sensor chip further comprising a first substrate with a first surface and a second surface comprising at least one CMOS circuit; a MEMS substrate with a first surface and a second surface; and a second substrate comprising at least one CMOS circuit. Where the first surface of the first substrate is attached to a packaging substrate and the second surface of the first substrate is attached to the first surface of the MEMS substrate. The second surface of the MEMS substrate is attached to the second substrate. The first substrate, the MEMS substrate, the second substrate and the packaging substrate are mechanically attached and provided with electrical inter-connects.

DETAILED DESCRIPTION OF PREFERRED EMBODIMENTS

Figure 1:
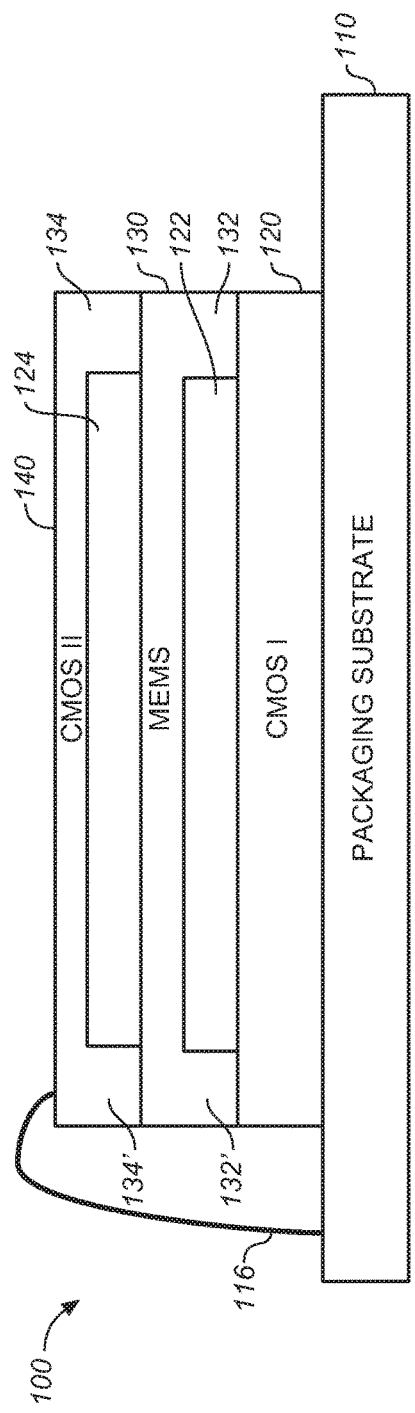
FIG. 1 illustrates a CMOS-MEMS-CMOS package showing a stress-relieving recess according to an embodiment of the present invention.

The present invention relates generally to micro-electro-mechanical systems (MEMS) devices, and more particularly to the package containing one or more substrates comprising CMOS circuits integrated with a MEMS substrate.

The following description is presented to enable one of ordinary skill in the art to make and use the invention and is provided in the context of a patent application and its requirements. Various modifications to the described embodiments and the generic principles and features described herein will be readily apparent to those skilled in the art. Thus, the present invention is not intended to be limited to the embodiments shown but is to be accorded the widest scope consistent with the principles and features described herein.

In the described embodiments Micro-Electro-Mechanical Systems (MEMS) refer to a class of structures or devices fabricated using semiconductor-like processes and exhibiting mechanical characteristics such as the ability to move or deform. MEMS often, but not always, interact with electrical signals. MEMS devices include but are not limited to gyroscopes, accelerometers, magnetometers, pressure sensors and radio-frequency components.

A MEMS substrate may be a MEMS wafer or a MEMS die containing one or more MEMS structures. Silicon wafers containing MEMS structures are referred to as MEMS wafers. Similarly, a CMOS substrate may be a CMOS wafer or a CMOS die. A CMOS substrate may be a substrate (a wafer or a die) containing one or more CMOS circuits.

In the described embodiments, MEMS device may refer to a semiconductor device implemented as a micro-electro-mechanical system. A MEMS structure may refer to any feature that may be part of a larger MEMS device. An engineered silicon-on-insulator (ESOI) substrate may refer to a SOI substrate with cavities beneath the silicon device layer or substrate. Handle substrate typically refers to a thicker substrate used as a carrier for the thinner silicon device substrate in a silicon-on-insulator substrate. Handle substrate can be a handle wafer or a handle die and may also be referred to as a MEMS cover.

In the described embodiments, a cavity may refer to an opening or recession in a substrate wafer and enclosure may refer to a fully enclosed space.

As more and more MEMS devices become smaller and smaller, it will be useful to have two different substrates where one or both the substrates comprise at least one CMOS circuit to provide electronic circuits connected to a MEMS substrate. This is particularly useful as more functionality can be added to the CMOS circuit containing substrates at the same time keeping the form factor small. For example, in an embodiment, the CMOS circuit containing substrate may also contain at least one sensor such as but not limited to a magnetometer, a temperature sensor, a gas sensor, a pressure sensor, a humidity sensor, an acoustic sensor, a proximity sensor, an ambient light sensor, an Infra-Red radiation sensor.

Furthermore, performance of the MEMs device can be improved due to lower parasitic interconnects. Combining a first CMOS substrate, a MEMS substrate and a second CMOS substrate in one package that is vertically stacked results in a smaller package with reduced requirements for board area or "real estate." This stacking structure is also beneficial when the upper CMOS die is smaller than the lower CMOS die and the MEMS die such as triple die stack, using the CMOS die as a cap.

In an alternate embodiment, the upper CMOS die may be of the same size or bigger than the MEMS die such that the upper CMOS die encapsulates the adjacent MEM die.

In an embodiment, at least one of the CMOS substrates may have denser electrical circuits (i.e. more electrical components per unit area) than the other CMOS substrate. A denser electrical circuit, for example, is an electrical circuit with at least one transistor with a channel length of less than 100 nm.

In an embodiment, a CMOS substrate and a MEMS substrate can be electrically connected to each other and to a packaging substrate using some combination of wire bonds, through-silicon vias (TSVs), solder bonding, or eutectic bonding. (For eutectic bonding, refer to U.S. Pat. No. 7,104,129 "Vertically Integrated MEMS Structure with Electronics in a Hermetically Sealed Cavity"). Additionally, if the MEMS substrate requires an electrical contact to the back side, it can be achieved with an additional wire bond, internal contacts, or a wedge cut. In an embodiment, bond wires and bond pads provide the electrical connections from either substrate to the packaging substrate. The last layer of metal deposited in the conventional CMOS metallization process is a metal layer suitable for use as a bond metal. In another embodiment, the electrical connections can be formed using through-silicon vias in CMOS as well as in MEMS substrate.

In an embodiment, a first CMOS substrate is mechanically connected to a MEMS substrate. The MEMS substrate is in turn mechanically connected to one side of a first CMOS substrate and a packaging substrate (package) is mechanically connected to the other side of the first CMOS substrate. Mechanical connections between the first CMOS substrate, MEMS substrate and second CMOS substrate can be provided by Si to $SiO_2$ fusion bonding and Si to Si fusion bonding, eutectic bonding, solder bonding or a low stress adhesive material. The bond between the packaging substrate (package) and the first CMOS substrate can be hermetic, or it can be non-hermetic. The first CMOS substrate can be mechanically bonded to the packaging substrate using a low stress adhesive material, such as Room Temperature Vulcanizing (RTV) silicone elastomer which is commonly used for a pressure sensor. The packaging substrate may be a multi-layer packaging substrate such as Land Grid Array (LGA).

In an embodiment, a bonded device substrate would comprise a MEMS substrate with a conductive layer such as an aluminum or copper top metallization layer, eutectically bonded to first and second CMOS substrates on either side of the MEMS substrate. An additional conductive layer on the back side of the MEMS substrate allows for electrical connections between the MEMS substrate and the first and the second CMOS substrates on either side. One of the CMOS substrate may comprise a cap layer with etched cavities coated by a thin silicon oxide layer and fusion bonded to a silicon device layer. The device layer may be patterned so as to define the desired moveable or stationary structure.

In an embodiment, the conductive layer may comprise any electrically conductive metal or semiconductor. An opening is etched in the back of the CMOS substrate, stopping on one of the CMOS metallization layers. The CMOS metallization layer may be any one of the existing CMOS metallization layers. The sidewalls of the opening are then electrically passivated by depositing an insulating film (ex. silicon oxide, silicon nitride, polymer). Typically the insulating film will also be deposited on the bottom surface of the opening, covering the previously exposed CMOS metallization layer. The CMOS metallization layer is then once again exposed by an etching or saw dicing process such that the insulating film on the sidewalls of the opening is not removed. This etching or saw dicing process may expose the surface, edges, or both of the CMOS metallization layer. A conductive interconnection layer (typically a metal layer composed of Aluminum or Copper) is deposited onto the back surface of the CMOS substrate and into the passivated openings so as to create electrical contact to the CMOS metallization layer. The interconnection layer is then patterned so as to create individual isolated contacts. A polymer stress-relief layer can optionally be deposited on top of the interconnection layer to reduce stress on the silicon substrate caused by board-level assembly. The stress-relief layer is patterned so as to create vias to the interconnection layer. Then a conductive redistribution layer is deposited and patterned on top of the stress-relief layer. Finally, solder balls are defined on top of the redistribution layer to facilitate soldering the packaged substrate to a printed circuit board.

In an embodiment, CMOS, MEMS and CMOS can be electrically connected to each other and to the substrate via wire bonds or through silicon vias (TSVs). In an embodiment, bond wire, wire bond pads and bond pads provide the electrical connections from the CMOS substrate to the packaging substrate. The last layer of metal deposited in the conventional CMOS process is a metal layer suitable for use as a bond metal.

In an embodiment, the electrical connections can be formed via TSVs in MEMS as well as in CMOS substrates. CMOS I is bonded to the MEMS substrate through eutectic bond whereas CMOS II is bonded to the MEMS substrate via TSVs. In an embodiment, the TSVs have to be positioned on top of the stand offs which provide electrical connection in the CMOS-MEMS-CMOS structure. To get the electrical connection through MEMS, the TSVs have to be etched through the MEMS after MEMS is bonded to CMOS I. The etching of TSVs through MEMS would stop at the Aluminum layer.

In an alternate embodiment, both CMOS I and CMOS II can be bonded to MEMS via TSVs.

Alternatively, two CMOS-MEMS structures can be provided either by eutectic bonding or by electrical connection via TSVs. The two CMOS-MEMS structures can then be bonded together. The MEMS-CMOS II bond can be either Cu micro bond or through exposed Cu via direct bond interconnect process.

In yet another embodiment, two CMOS substrates, can be connected to two separate MEMS substrates, for example, actuators, via eutectic bands with a cap layer in between the two MEMS substrates. A CAP layer can be connected to the MEMS substrates via fusion bonds. For the structure to technically work the main challenge is to get all wafers as flat as possible. In an embodiment, there may be a cavity in the back side of the CAP layer with flat surface of the MEMS substrate on top of the cavity. The cap layer is a thin protective layer that prevents oxidation of the underlying layers and may be made of a suitable insulating material, for example, silicon.

Alternatively, two separate structures are provided with a CMOS-Actuator-CAP and can be mechanically connected. TSVs are provided through actuator wafers for electrical connections. In an embodiment, the CAP layer comprises a CMOS substrate.

FIG. 1 illustrates a CMOS-MEMS-CMOS package according to an embodiment of the present invention. The package 100 as illustrated in FIG. 1 contains a packaging substrate 110, CMOS substrate CMOS I 120, a MEMS substrate 130 and another CMOS substrate CMOS II 140, wherein the CMOS I 120 and/or CMOS II 140 comprise at least one electrical circuit. In an embodiment, at least one of the CMOS I 120 and the CMOS II 140 may have denser electrical circuits (i.e. more electrical components per unit area). A denser electrical circuit, for example, may be an electrical circuit with at least one transistor with a channel length of less than 100 nm. The CMOS I 120 has a first surface and a second surface. The packaging substrate 110 is mechanically connected with the first surface of CMOS I 120. Similarly, the MEMS substrate 130 has a first surface and a second surface. The second surface CMOS I 120 is mechanically and electrically connected to the first surface of the MEMS substrate 130. The second surface of the MEMS substrate 130 is mechanically and electrically connected to the second CMOS substrate CMOS II 140. The mechanical connections can be provided by any of eutectic bonding, fusion bonding, solder bonding, low stress adhesive material and a combination thereof. The electrical connections are provided using a combination of wire bonds, TSVs, solder bonding, or eutectic bonding.

In an embodiment, the electrical interconnects between the first CMOS substrate CMOS I 120, the MEMS substrate 130 and the second CMOS substrate CMOS II 140 comprise one or more eutectic bonds. In another embodiment, at least one of the CMOS I 120 and the CMOS II 140 is connected to the MEMS substrate 130 by an eutectic bond and the electrical connection between the at least one of the CMOS I 120 and the CMOS II 140 is connected to the MEMS substrate is provided by the eutectic bond. CMOS II 140 is connected to the packaging substrate 110 through wire bonds 116. In another embodiment, at least one of the CMOS I 120 and the CMOS II 140 is connected to the MEMS substrate 130 by a low temp diffusion bond.

The MEMS substrate 130 further comprises at least one etched cavity 122 to form standoffs 132 and 132', wherein the standoffs 132 and 132' define one or more electrical interconnects and a vertical gap between the CMOS substrate CMOS I 120 and the MEMS substrate 130. As shown in FIG. 1, the CMOS II substrate 140 further comprises at least one etched cavity 124 to form standoffs 134 and 134', wherein the standoffs 134 and 134' define one or more electrical interconnects and a vertical gap between the CMOS substrate, CMOS II 140 and the MEMS substrate 130. The vertical gaps 122 and 124 thus formed may be of the similar heights or of different heights.

Figure 2:
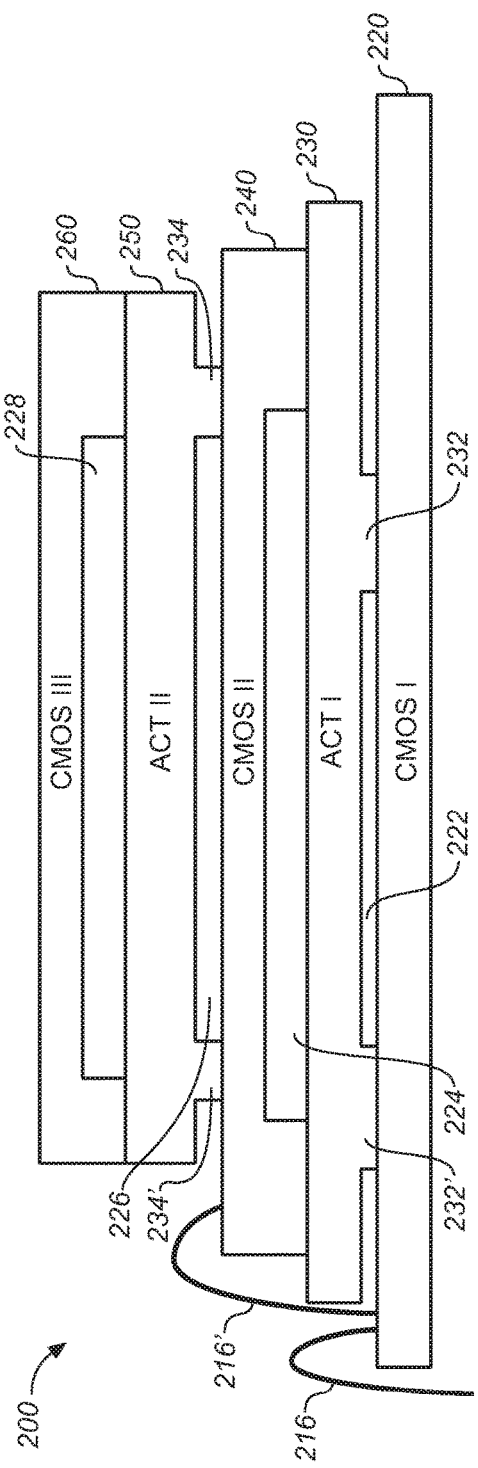
FIG. 2 illustrates a second CMOS-MEMS-CMOS package with second and third CMOS substrates built in cap layers in accordance with an embodiment

FIG. 2 illustrates a second CMOS-MEMS-CMOS package 200 with CMOS substrates built in cap layers in accordance with an embodiment. The package 200 as illustrated in FIG. 2 comprises three CMOS substrates, CMOS I 220, CMOS II 240 and CMOS III 260 and two MEMS substrates, for example, MEMS actuators, ACT I 230 and ACT II 250. The CMOS substrates, CMOS II 240 and CMOS III 260 are built in the respective cap layers, thus providing CMOS functionality along with protective covering for the underlying layers. The MEMS substrates ACT I 230 and ACT II 250 each have a first surface and a second surface. The CMOS substrate CMOS I 220 is mechanically and electrically connected to the first surface of the first MEMS substrate ACT I 230. The second surface of the MEMS substrate ACT I 230 is mechanically and electrically connected to the second CMOS substrate CMOS II 240 at the first surface. Similarly, The CMOS substrate CMOS II 240 is mechanically and electrically connected to the first surface of the second MEMS substrate ACT II 250. The second surface of the MEMS substrate ACT II 250 is mechanically and electrically connected to the third CMOS substrate CMOS III 260. The mechanical connections can be provided by any of eutectic bonding, fusion bonding, solder bonding, low stress adhesive material and a combination thereof. The electrical connections are provided using a combination of wire bonds, TSVs, solder bonding, or eutectic bonding.

The CMOS substrates CMOS II 240 and CMOS III 260 may have cavities etched or patterned into the CMOS substrates forming CAP layers as shown in FIG. 2. The cavity etched or patterned in the cap layer, CMOS II, 240 forms a vertical gap 224 between CMOS II 240 and ACT I 230 and the cavity etched or patterned in the cap layer, CMOS III, 260 forms a vertical gap 228 between CMOS III 260 and ACT II 250. In an embodiment, the vertical gap 224 may be different from the vertical gap 228.

In an embodiment, the MEMS substrate ACT I 230 further comprises at least one etched cavity 222 and ACT II 250 further comprises at least one etched cavity 226 to form standoffs 232 and 232' and 234 and 234' respectively. The standoffs 232 and 232' and 234 and 234' define one or more electrical interconnects and vertical gaps between the first CMOS substrate CMOS I 220 and the first MEMS substrates ACT I 230 and the second CMOS substrate CMOS II 240 and the second MEMS substrates ACT II 250 respectively.

The first MEMS substrate ACT I, 230 is connected to the first CMOS substrate CMOS I 220 and the second CMOS substrate CMOS II 240 by eutectic or fusion bonding and the second MEMS substrate, ACT II, 250 is connected to the second CMOS substrate CMOS II 240 and the third CMOS substrate CMOS III 260 by eutectic or fusion bonding as shown in FIG. 2. In an embodiment, the first MEMS substrate ACT I 230 and the second MEMS substrate ACT II 250 each have different thickness. In an embodiment, the vertical gap 222 formed by stand offs 232 and 232' between the first MEMS substrate ACT I 230 and the first CMOS substrate CMOS I 220 may be different from the vertical gap 226 formed by stand offs 234 and 234' between the second MEMS substrate ACT II 250 and the second CMOS substrate CMOS II 240. Electrical connections between the CMOS substrates, CMOS I 220 and/or CMOS II 240, and a packaging substrate (not shown) can be provided through wire bonds 216 and 216'.

Alternatively, two CMOS-MEMS structures (ACT I 230-CMOS II 240 and ACT II 250-CMOS III 260) can be provided separately either by eutectic bonding or by electrical connection via TSVs. The two structures can then be bonded together via a bond between ACT II 250-CMOS II 240. The MEMS-CMOS II bond between the two separate MEMS-CMOS structures can be either via Cu micro bonds or through exposed Cu via direct bond interconnect process. Similar to the description of FIG. 1, one or more of the multiple CMOS substrates may have a denser electrical circuit than the other CMOS substrates.

Figure 3:
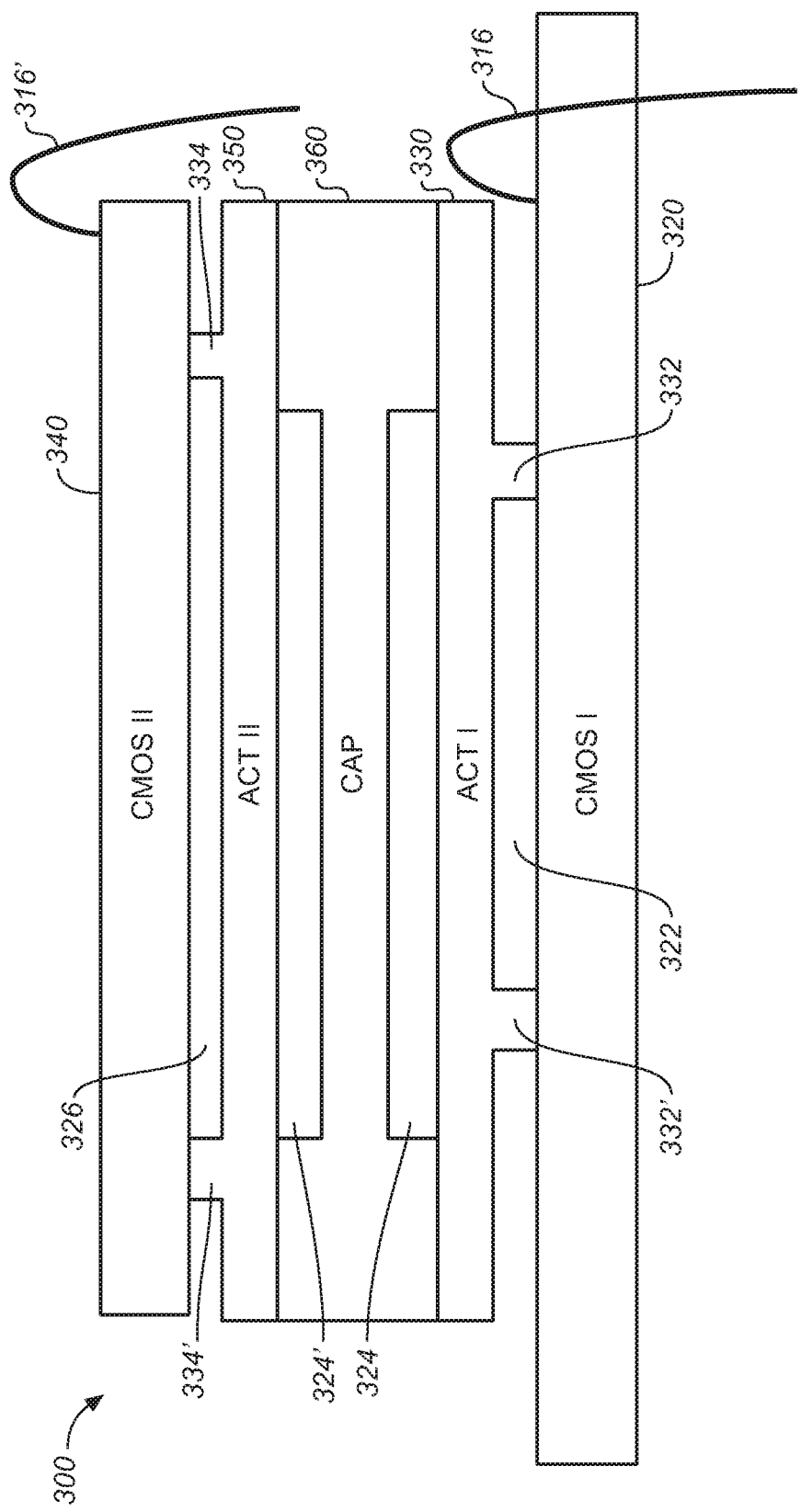
FIG. 3 illustrates a third CMOS-MEMS-CMOS package in accordance with an embodiment.

FIG. 3 illustrates a third CMOS-MEMS-CMOS package 300 in accordance with an embodiment. As shown as FIG. 3, the package 300 comprises two CMOS substrates CMOS I 320 and CMOS II 340, two MEMS substrates, ACT I 330 and ACT II 350, and a cap layer 360. The first CMOS substrate, CMOS I 320 is connected to the first MEMS substrate, ACT I 330 via a eutectic bond, and the second CMOS substrate, CMOS II 340 is connected to the second MEMS substrate, ACT II 350 via eutectic band. The CAP layer 360 is connected to ACT I 330 and ACT II 350 via fusion bond. For the structure to technically work the main challenge is to get all wafers as flat as possible. As shown in FIG. 3, there is a cavity 324' in the back side of the CAP layer 360 with flat surface of MEMS substrate ACT II 350 on top of the cavity 324'.

In an embodiment, the MEMS substrate ACT I 330 further comprises at least one etched cavity 322 and ACT II 350 further comprises at least one etched cavity 326 to form standoffs 332 and 332' and 334 and 334' respectively. The standoffs 332 and 332' and 334 and 334' define one or more electrical interconnects and vertical gaps between the first CMOS substrate CMOS I 320 and the first MEMS substrates ACT I 330 and the second CMOS substrate CMOS II 340 and the second MEMS substrates ACT II 350 respectively. In an embodiment, the first MEMS substrate ACT I, 330 is connected to the first CMOS substrate CMOS I 320 and the second MEMS substrate, ACT II, 350 is connected to the second CMOS substrate CMOS II 340 by eutectic or fusion bonding as shown in FIG. 3. The vertical gaps 322 and 326 thus formed may be of the similar heights or of different heights.

Electrical connections between the CMOS substrates, CMOS I 320 and/or CMOS II 340 and a packaging substrate (not shown) can be provided through wire bonds 316 and 316' respectively.

In an embodiment, mechanical connections can be provided by any of eutectic bonding, fusion bonding, solder bonding, low stress adhesive material and a combination thereof. The electrical connections are provided using a combination of wire bonds, TSVs, solder bonding, or eutectic bonding.

Alternatively, two separate structures comprising a CMOS substrate, a MEMS substrate and a cap layer can be provided as CMOS-Actuator-CAP structures and can be mechanically connected. TSVs can be provided through actuator or MEMS wafers for electrical connections. In an embodiment, the CAP layer comprises a CMOS substrate.

Figure 4:
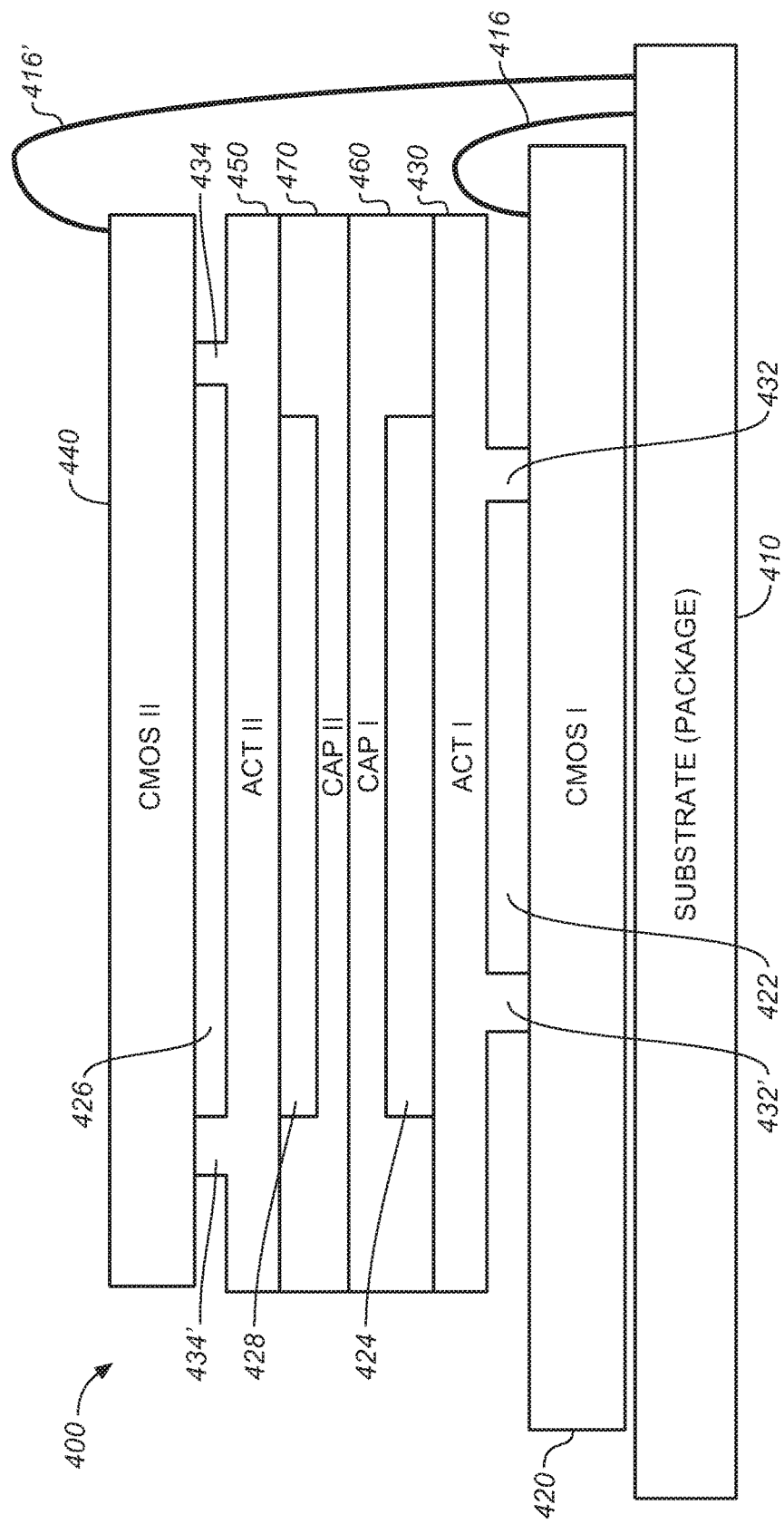
FIG. 4 illustrates a fourth CMOS-MEMS-CMOS package in accordance with an embodiment.

FIG. 4 illustrates a fourth CMOS-MEMS-CMOS package 400 in accordance with an embodiment. As shown as FIG. 4, the package 400 comprises a packaging substrate 410, two CMOS substrates CMOS I 420 and CMOS II 440, two MEMS substrates, ACT I 430 and ACT II 450, and two cap layers, CAP I 460, and CAP II 470. The first CMOS substrate, CMOS I 420 is connected to the first MEMS substrate, ACT I 430 via a eutectic bond, and the second CMOS substrate, CMOS II 440 is connected to the second MEMS substrate, ACT II 450 via eutectic band. The mechanical connections can be provided by any of eutectic bonding, fusion bonding, solder bonding, low stress adhesive material and a combination thereof. The electrical connections can be provided using a combination of wire bonds, TSVs, solder bonding, or eutectic bonding.

The MEMS substrate ACT I 430 further comprises at least one etched cavity 422 and ACT II 450 further comprises at least one etched cavity 426 to form standoffs 432 and 432' and 434 and 434' respectively. The standoffs 432 and 432' and 434 and 434' define one or more electrical interconnects and vertical gaps between the first CMOS substrate CMOS I 420 and the first MEMS substrates ACT I 430 and the second CMOS substrate CMOS II 440 and the second MEMS substrates ACT II 450 respectively, similar to the ones described in FIG. 3.

The first CAP layer CAP I 460 is connected to the first MEMS substrate ACT I 430 and the second cap layer CAP II 470 is connected to the second MEMS substrate ACT II 450 via fusion bond. For the structure to technically work the main challenge is to get all wafers as flat as possible. As shown in FIG. 4, there are cavities 424 and 428 on one side of the CAP layers CAP I 460 and CAP II 470 with flat surfaces of the MEMS substrates ACT I 430 on the bottom of cavity 424 and ACT II 450 on top of the cavity 428.

Electrical connections between the CMOS substrates, CMOS I 420 and/or CMOS II 440, and a packaging substrate 410 can be provided through wire bonds 416 and 416'.

Alternatively, two separate structures comprising a CMOS substrate, a MEMS substrate and a cap layer can be provided as CMOS-Actuator-CAP structures and can be mechanically connected. TSVs can be provided through actuator or MEMS wafers for electrical connections. In an embodiment, at least one of the two CAP layers comprises a CMOS substrate. In another embodiment, each of the two CAP layers comprises a CMOS substrate.

Figure 5:
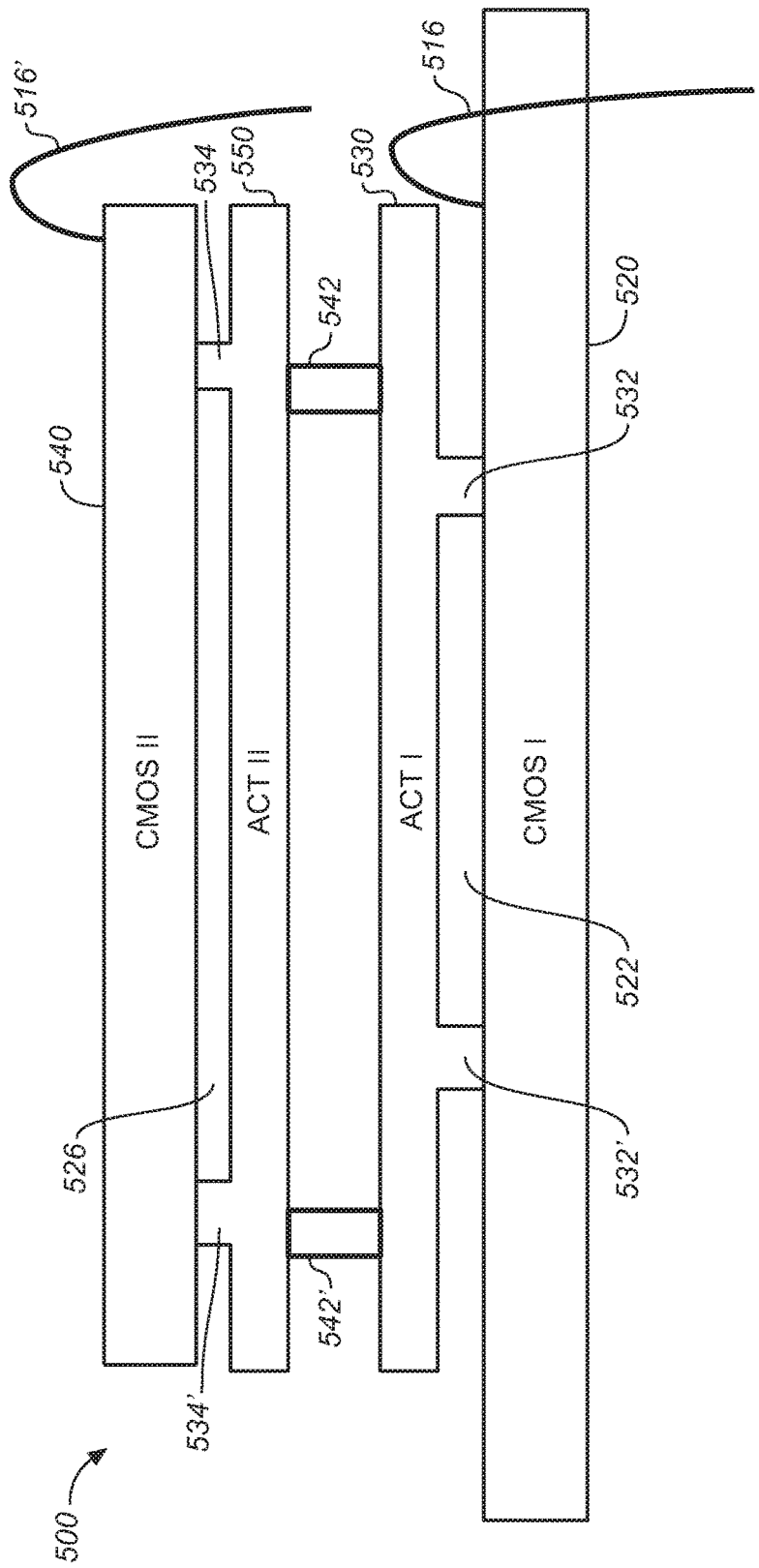
FIG. 5 illustrates a fifth CMOS-MEMS-CMOS package in accordance with an embodiment.

FIG. 5 illustrates a fifth CMOS-MEMS-CMOS package 500 in accordance with an embodiment. As shown as FIG. 5, the package 500 comprises two CMOS substrates CMOS I 520 and CMOS II 540, two MEMS substrates, ACT I 530 and ACT II 550, and two mechanical connections 542 and 542'. The first CMOS substrate, CMOS I 520 is connected to the first MEMS substrate, ACT I 530 via a eutectic bond, and the second CMOS substrate, CMOS II 540 is connected to the second MEMS substrate, ACT II 550 via eutectic band. The mechanical connections between ACT I 530 and ACT II 550 can be provided by any of eutectic bonding, fusion bonding, solder bonding, low stress adhesive material and a combination thereof. The electrical connections are provided using a combination of wire bonds, TSVs, solder bonding, or eutectic bonding.

The MEMS substrate ACT I 530 further comprises at least one etched cavity 522 and ACT II 550 further comprises at least one etched cavity 526 to form standoffs 532 and 532' and 534 and 534' respectively. The standoffs 532 and 532' and 534 and 534' define one or more electrical interconnects and vertical gaps between the first CMOS substrate CMOS I 520 and the first MEMS substrates ACT I 530 and the second CMOS substrate CMOS II 540 and the second MEMS substrates ACT II 550 respectively similar to the ones described in FIG. 3.

Electrical connections between the CMOS substrates, CMOS I 520 and/or CMOS II 540, and a packaging substrate (not shown) can be provided through wire bonds 516 and 516'.

Alternatively, two separate structures comprising a substrate comprising at least one CMOS circuit and a MEMS substrate can be provided as CMOS-Actuator structures and can be mechanically connected. TSVs can be provided through actuator or MEMS wafers for electrical connections.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A sensor chip comprising:
   a first substrate with a first surface and a second surface comprising at least one CMOS circuit;
   a MEMS substrate with a first surface and a second surface on opposing sides of the MEMS substrate; and
   a second substrate comprising at least one CMOS circuit;
   wherein the first surface of the first substrate is attached to a packaging substrate and the second surface of the first substrate is attached to the first surface of the MEMS substrate; and wherein the second surface of the MEMS substrate is attached to the second CMOS substrate; and wherein the first substrate, the MEMS substrate, the second substrate and the packaging substrate are mechanically attached and provided with electrical interconnects.

2. The sensor chip of claim 1, wherein the MEMS substrate further comprises at least one MEMS structure, wherein the MEMS structure is enclosed within the first and the second substrates.

3. The sensor chip of claim 1, wherein the second substrate comprising at least one CMOS circuit further comprises at least one sensor such as a magnetometer, a temperature sensor, a gas sensor, a pressure sensor, a humidity sensor, an Infra-Red radiation sensor, an acoustic sensor, a proximity sensor, an ambient light sensor or a combination thereof.

4. The sensor chip of claim 1, wherein the MEMS substrate further comprises at least one MEMS structure, wherein the MEMS structure comprises any of a gyroscope, an accelerometer, a resonator, a magnetometer or a combination thereof.

5. The sensor chip of claim 4, wherein one of the first or the second substrates has at least one transistor with channel length <100 nm.

6. The sensor chip of claim 1, wherein the electrical interconnects between the MEMS substrate and at least one of the first substrate and the second substrate comprise a eutectic bond.

7. The sensor chip of claim 1, wherein the MEMS substrate is connected to the first substrate and/or the second substrate by a low temp diffusion bond.

8. The sensor chip of claim 1, wherein the MEMS substrate further comprises at least one etched cavity to form standoffs, wherein the standoffs define one or more electrical interconnects and a vertical gap between the first CMOS substrate and the MEMS substrate.

9. The sensor chip of claim 1, wherein the second substrate further comprises a first surface and a second surface, wherein the first surface of the second substrate is attached to the second surface of the MEMS substrate, and wherein the second surface of the second substrate further comprises a metal layer and wherein the electrical inter-connects between the second substrate and the packaging substrate comprises a wire-bond.

10. The sensor chip of claim 1, wherein the electrical inter-connects further comprise any of through silicon via, solder bond, wire bond and a combination thereof.

11. The sensor chip of claim 1, wherein the mechanical attachment is provided by any of eutectic bonding, thermo-compression bonding, fusion bonding, solder bonding, low stress adhesive material and a combination thereof.

* * * * *